United States Patent [19]

Miedema et al.

[11] Patent Number: 5,104,848
[45] Date of Patent: Apr. 14, 1992

[54] DEVICE AND METHOD OF MANUFACTURING A DEVICE

[75] Inventors: Andries R. Miedema; Gerrit J. Van Der Kolk; Johan P. W. B. Duchateau, all of Eindhoven, Netherlands

[73] Assignee: U.S. Philips Corporation, New York, N.Y.

[21] Appl. No.: 338,922

[22] Filed: Apr. 14, 1989

[30] Foreign Application Priority Data

Apr. 21, 1988 [NL] Netherlands ............... 8801032

[51] Int. Cl.$^5$ .................................... H01B 12/00
[52] U.S. Cl. ................................ 505/1; 357/5; 505/702
[58] Field of Search ............. 357/5, 4; 505/72, 874, 505/1

[56] References Cited

U.S. PATENT DOCUMENTS

| | | | |
|---|---|---|---|
| 4,454,522 | 6/1984 | De Lozanne | 357/5 |
| 4,470,190 | 9/1984 | Fulton et al. | 357/5 |
| 4,837,609 | 6/1989 | Gurvitch et al. | 357/5 |

FOREIGN PATENT DOCUMENTS

| | | | |
|---|---|---|---|
| 0323342 | 7/1989 | European Pat. Off. | 357/5 |
| 57-78187 | 5/1982 | Japan | 357/5 |
| 0006188 | 1/1983 | Japan | 505/874 |
| 0147179 | 8/1985 | Japan | 357/5 |
| 60-169175 | 9/1985 | Japan | 357/5 |
| 61-102788 | 5/1986 | Japan | 357/5 |
| 62-248272 | 10/1987 | Japan | 357/5 |
| 7104727 | 10/1971 | Netherlands | 505/874 |

OTHER PUBLICATIONS

R. F. Broom and W. Water, Planarized Structure for Josephson Tunnel Junctions, Mar. 1984, IBM Technical Disclosure Bulletin vol. 26 N. 10A.

Primary Examiner—Andrew J. James
Assistant Examiner—Hung Xuan Dang
Attorney, Agent, or Firm—Norman N. Spain

[57] ABSTRACT

A device comprising semiconductor elements and conductor tracks of an oxidic superconducting material, electrically conductive connections being formed between semiconductor elements and conductor tracks, is provided with an electrically conductive antidiffusion layer between the semiconductor elements and the conductor tracks. The antidiffusion layer is composed of an amorphous alloy having the composition $A_xE_{1-x}$, wherein A is selected from one or more of the elements Zr, Nb, Mo, Ru, Rh, Pd, Hf, Ta, W, Re, Os, Ir and Pt, wherein E is selected from one or more of the elements B, Si, Al, Ga and Ge, and wherein x has a value of from 0.7 to 0.95.

4 Claims, 1 Drawing Sheet

DEVICE AND METHOD OF MANUFACTURING A DEVICE

BACKGROUND OF THE INVENTION

The invention relates to a device comprising semiconductor elements and elements of an oxidic material, electrically conductive connections being provided between the semiconductor elements and the oxidic elements, the electrically conductive connections comprising at least one antidiffusion layer. If desired, the electrically conductive connection may be formed exclusively by the antidiffusion layer.

The invention also relates to a method of manufacturing such a device.

As oxidic elements there can be used, for example: conductor tracks of an oxidic superconducting material and dielectric elements of a ceramic material such as titanates and zirconates, for example barium titanate.

In an article by M. Gurvitch and A. T. Fiory in Applied Physics Letters 51 (13), pages 1027 to 1029 (1987), a description is given of a method for the patterned manufacture of thin films of the superconducting compound $YBa_2Cu_3O_7$ on various substrates, inter alia, silicon. In practice it was found that most substrates require an antidiffusion layer. For this purpose, not only electrically insulating layers but also electrically conductive antidiffusion layers were investigated such as layers of Ag, Nb and Cu, but this did not lead to the desired result on silicon substrates because the layers adhered poorly and the oxidic compound did not exhibit superconducting behaviour at the desired temperatures (above 77 K.).

Substrates on which oxidic superconducting materials can be satisfactorily provided are in general insulating oxidic materials such as MgO, $ZrO_2$ and $SrTiO_3$, and noble metals such as gold and silver. Gold and silver can be used to form electrically conductive connections, but they do not form an effective diffusion barrier. Moreover, because of the possible formation of a Si-Au eutectic composition at a low temperature gold is less suitable for use in contact with semiconductor devices. Silver, too, is less suitable for this purpose because of the high diffusion rate of silver.

Antidiffusion layers for use in semiconductor devices must meet a number of requirements. In semiconductor technology, for example, protective layers of $Si_3N_4$ are used which are applied at a temperature of 450° C. At this temperature there must be no undesired reactions in and between the previously applied layers. Nor must there be oxidation of the antidiffusion layers at this temperature.

SUMMARY OF THE INVENTION

It is an object of the invention to provide electrically conductive antidiffusion layers which can be used in the manufacture of semiconductor devices at customary temperatures (up to 550° C.) and in customary methods. The antidiffusion layers must not react with semiconductor materials such as Si, SiGe, GaAs or with superconducting oxidic materials such as $YBa_2Cu_3O_7$. The antidiffussion layers must be composed of a material which has a stable structure and which does not oxidize at a low temperature (below 450° C.).

According to the invention, this object is achieved by a device as described in the opening paragraph, in which the antidiffusion layer is composed of an amorphous alloy of the composition $A_xE_{1-x}$ wherein A is selected from one or more of the elements Zr, Nb, Mo, Ru, Rh, Pd, Hf, Ta, W, Re, Os, Ir and Pt, wherein E is selected from one or more of the elements B, Si, Al, Ga and Ge, and wherein x has a value of from 0.7 to 0.95. Preferably, both Si and B are added in an overall quantity of from 5 to 30 mol %. The crystallization temperature of the alloy is at least 900 K.

By using an amorphous alloy, an effective diffusion barrier is obtained because there can be no transport along grain boundaries since grain boundaries do not exist in amorphous alloys. The amorphous layers are stable because the temperatures to which the amorphous layers are exposed during further processing of the semiconductor device remain well below the crystallization temperature. At temperatures up to 800 K. the alloys selected do not react with elements of semiconductor materials such as Si, Ge, Ga and As. An additional advantage is that at temperatures up to 800 K. the alloys do not react with aluminum which may be used in conductor tracks on semiconductor devices. Aluminum layers may be applied to the device both before and after applying the amorphous metal alloys.

DETAILED DESCRIPTION OF THE INVENTION

Figure 1:
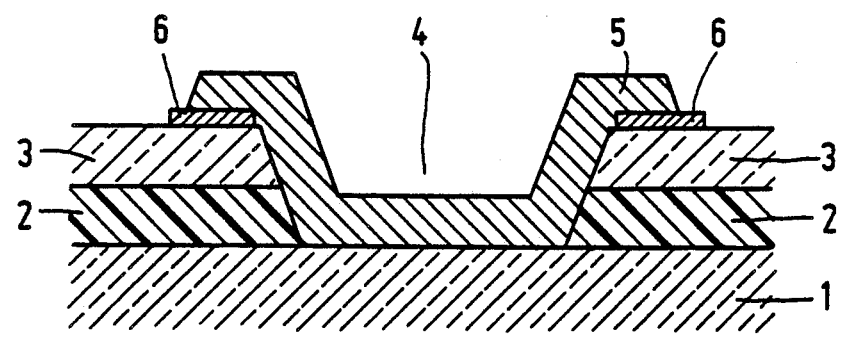
FIGS. 1 and 2 are diagrammatic over-sectional view of two embodiments of devices having electrically conductive connections according to the invention.

Thin films of oxidic superconducting materials are applied at a high temperature or are given an aftertreatment at a high temperature in air or oxygen to obtain the desired oxygen content and, hence, the desired superconducting properties. In an article by H. Adachi et al. in Applied Physics Letters 51 (26), pages 2263 to 2265 (1987), a description is given of a method by means of which superconducting $YBa_2Cu_3O_7$ can be manufactured at the relatively low temperature of 650° C. At this temperature, some of the amorphous metal alloys discussed above may be subject to oxidation. For this reason, the method of manufacturing a semiconductor device having superconducting tracks is preferably carried out in a manner such that the firing of the superconducting material can be carried out before the amorphous metal alloy is provided.

According to the invention, the object of providing a method of manufacturing a device comprising semiconductor elements and elements of oxidic material is achieved by a method in which in order to obtain the desired properties the oxidic material is fired after it has been provided, the electrically conductive connections being provided after firing via patterned apertures in the oxidic material.

The desired properties which are obtained by means of firing may relate to both the superconducting behaviour and the dielectric properties.

Layers of, for example, MgO and $SrTiO_3$ may be used in known manner as the electrically insulating layers between the superconducting tracks and the underlying semiconductor elements which are not to contact each other electrically.

An oxidic superconducting material which may be used in the device and method according to the invention is $(La, Sr)_2CuO_4$, wherein Sr may be substituted by Ba. Another suitable oxidic superconducting material is $YBa_2Cu_3O_{7-\delta}$, wherein $\delta$ has a value of from 0.1 to 0.5. $YBa_2Cu_3O_{7-\delta}$ has a $T_c$ value of approximately 90 K. In the compositional formula shown, oxygen may be partly substituted by fluorine, for example up to 1 atom, which leads to an increase of $T_c$. Further, Y may be substituted by one or more rare earth metals and Ba may be substituted by another alkaline earth metal, for example Sr. $T_c$ is the critical temperature below which the material exhibits superconducting behaviour. According to the invention, other oxidic superconducting materials may also be used such as, for example, a cuprate comprising Bi-Ca-Sr or Tl-Ca-Ba, having a $T_c$ above 100 K.

In U.S. Pat. No. 4,546,373 a description is given of the use of amorphous TaIr alloys as an antidiffussion layer between GaAs and Au in a semiconductor device at temperatures up to 773 K. The amorphous TaIr does not contact superconducting or oxidic materials. Its use with superconducting compounds is not very likely because it has been found that only few materials can suitably be used in contact with oxidic superconducting materials at a high temperature. In this connection, the only metals known are the noble metals gold and silver.

In the un-prepublished Netherlands Patent Application NL 8800857 in the name of Applicants, a description is given of the use of amorphous alloys for the above-described purpose. These amorphous alloys do not comprise Si and/or B and can have lower crystallization temperatures than the amorphous alloys according to the invention.

The invention will now be explained in greater detail by means of exemplary embodiments and with reference to the drawing.

DESCRIPTION OF THE PREFERRED EMBODIMENTS

EXAMPLE 1

From the forming temperature of the alloys it can be deduced that the following alloys of transition metals only react at a high temperature with, for example, semiconductor materials: TaIr, TaPt, TaPd, TaRh, HfPt, HfPd, ZrPt, ZrAu, ZrPd, NbIr, NbPt, NbRh, NbPd, YPt, YPd, VIr, TiIr, TiPt, TiRh, TiPd, ScPt, ScAu and ScPd.

For amorphous alloys having the composition $A_xG_{1-x}$ wherein A is selected from Zr, Hf, Nb and Ta and G is selected from Ir, Pd and Pt, the crystallization temperature was determined for a number of values of x. For this purpose, thin films of the amorphous alloys were manufactured by means of vapour deposition on NaCl single-crystals. The amorphous alloys were fired at increasing temperatures and cooled to measure the crystallinity. The crystallinity was determined by means of X-ray diffraction and electron diffraction.

The Table below lists a composition range and the associated lowest crystallization temperature $T_k$ of a number of alloys.

TABLE

| A | G | x | $T_k$ (K) |
|---|---|---|---|
| Ta | Ir | 0.4–0.7 | 1170 |
| Ta | Pt | 0.4–0.75 | 1170 |
| Hf | Pt | 0.4–0.7 | 970 |
| Zr | Pt | 0.4–0.7 | 900 |
| Nb | Ir | 0.4–0.7 | 1100 |
| Nb | Pt | 0.5–0.8 | 1100 |
| Ta | Pd | 0.4–0.7 | 1100 |
| Hf | Pd | 0.5–0.8 | 900 |
| Nb | Pd | 0.4–0.75 | 1020 |

It has been found that the crystallization temperature can be substantially increased by adding Si and/or B to these alloys. Moreover, in devices according to the invention a larger group of amorphous alloys can be used which, despite of the fact that they comprise only one transition metal, have a sufficiently high crystallization temperature, such as, for example, $Ta_{0.8}Si_{0.1}B_{0.1}$.

Since the above-mentioned article by L. S. Hung et al. states that a reaction between an amorphous metal alloy and silicon may take place at a temperature below the crystallization temperature, a number of experiments were conducted in which amorphous metal alloys were brought into contact with a number of materials and heated. The results were analysed by means of X-ray diffraction and Rutherford backscattering spectrometry (RBS).

Thin layers of TaIr and TaPd were provided on silicon by means of electron beam evaporation. When compositions are used having values of x as listed in the Table, no reaction occurs between the amorphous metal alloy and the substrate at temperatures up to 1050 K. in the case of TaIr, and 850 K. in the case of TaPd.

A $YBa_2Cu_3O_7$ film having a thickness of 1 $\mu m$ was provided on a thin layer of TaIr on a silicon substrate by means of laser ablation. On heating in oxygen, the amorphous metal alloy oxidizes at a temperature of 770 K., while forming a polycrystalline oxide. There is no reaction with the superconducting material at temperatures up to 920 K. and with silicon up to 1120 K. For the other amorphous metal alloys the temperature at which oxidation occurs also ranges between 750 and 850 K.

A $YBa_2Cu_3O_7$ film having a thickness of 1 $\mu m$ was provided on a $SrTiO_3$ substrate by means of radio-frequency sputtering of the metals, followed by oxidation. Subsequently, a layer of TaIr was provided which does not react in vacuum with the superconducting compound at temperatures up to 1020 K.

EXAMPLE 2

FIG. 1 shows a silicon substrate 1 on which a patterned insulation layer 2 of magnesium oxide is provided which carries an oxidic superconducting film 3 of $YBa_2Cu_3O_{6.7}$. For example, GaAs can alternatively be used as a substrate material. The insulating layer can alternatively be formed from $SrTiO_3$ or $ZrO_2$.

A suitable method of providing an oxidic superconducting film is described in, for example, the above-mentioned article by H. Adachi et. al. A suitable method of manufacturing such layers in accordance with a pattern is described in, for example, the above-mentioned article by M. Gurvitch and A. T. Fiory.

By means of an aperture 4 in the insulation layer 2 and the superconducting film 3, an electrically conductive connection is formed between the semiconductor material 1 and the superconducting film 3 through a layer 5 of an amorphous metal alloy. According to the present example, the layer 5 is composed of, $(Mo_{0.6}Ru_{0.4})_{0.82}B_{0.18}$ having a crystallization temperature above 1040 K.

If desired, a layer 6 of silver or gold may be applied between the superconducting film 3 and the amorphous metal layer 5 to improve the electric contact.

In the following steps in the manufacture of the semiconductor device no temperatures exceeding 800 K. are used. The result is a satisfactory electrically conductive contact between a conductor track of a superconducting material and (not shown) semiconductor elements in the substrate, mutual diffusion being prevented.

EXAMPLE 3

Figure 2:
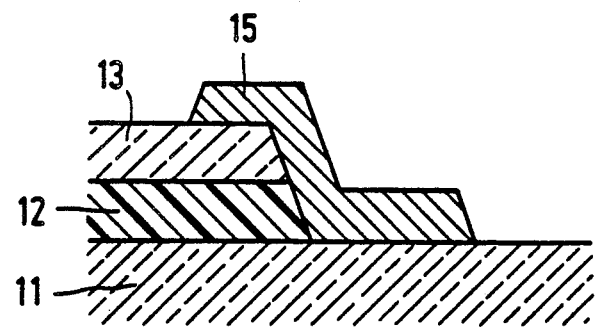

FIG. 2 shows a substrate 11, for example, of silicon on which a patterned electrically insulating layer 12 of, for example, silicon oxide is provided. A layer 13 of $BaTiO_3$ is provided on top thereof.

An electrically conductive connection 15 is formed between the substrate 11 and the dielectric material 13 in the manner indicated in example 2. The amorphous metal layer 15 is composed of $(Ta_{0.3}W_{0.7})_{0.8}Si_{0.1}B_{0.1}$ having a crystallization temperature above 1450 K. This alloy is described in an article by T. Yoshitake et. al., in Proceedings 6$^{th}$ International Conference on Rapidly Quenched Metals, Montreal, August 1987.

EXAMPLE 4

Devices are manufactured according to the method described in example 2, in which alloys of W and B are used having the compositions $W_{0.8}B_{0.2}$ and $W_{0.7}B_{0.3}$. These alloys have a crystallization temperature which exceeds 1270 K. and do not react with silicon at temperatures below 1070 K.

We claim:

1. A device comprising semiconductor elements and elements of an oxidic material, electrically conductive connections being provided between said semiconductor elements and said elements of oxidic material, said electrically conductive connections comprising at least one antidiffusion layer composed of an amorphous alloy of the composition $A_xE_{1-x}$, wherein A is at least one element selected from the group consisting of Zn, Nb, Mo, Ru, Rh, Pd, Hb, Ta, W, Re, Os, Ir and Pt, wherein E is B or a mixture of B and Si and wherein X has a value of 0.7 to 0.95.

2. A device as claimed in claim 1, characterized in that the elements of oxidic material are conductor tracks of an oxidic superconducting material.

3. A device as claimed in claim 2, characterized in that E is composed of Si and B, in an overall quantity of from 5 to 30 mol %.

4. A device as claimed in claim 1, characterized in that the elements of oxidic material are dielectric elements of a ceramic material.

* * * * *